(12) United States Patent
Kito et al.

(10) Patent No.: US 11,350,550 B2
(45) Date of Patent: May 31, 2022

(54) COMPONENT MOUNTING MACHINE AND METHOD FOR DETERMINING DROPPING OF COMPONENT

(71) Applicant: FUJI CORPORATION, Chiryu (JP)

(72) Inventors: Rie Kito, Chita (JP); Hidetoshi Kawai, Anjo (JP); Norio Hosoi, Chiryu (JP); Mizuho Nozawa, Kota-cho (JP); Jun Iisaka, Nisshin (JP); Hidetoshi Ito, Okazaki (JP); Shingo Fujimura, Toyoake (JP); Kenzo Ishikawa, Kariya (JP); Yusuke Yamakage, Anjo (JP)

(73) Assignee: FUJI CORPORATION, Chiryu (JP)

( * ) Notice: Subject to any disclaimer, the term of this patent is extended or adjusted under 35 U.S.C. 154(b) by 4 days.

(21) Appl. No.: 16/647,961

(22) PCT Filed: Sep. 22, 2017

(86) PCT No.: PCT/JP2017/034378
§ 371 (c)(1),
(2) Date: Mar. 17, 2020

(87) PCT Pub. No.: WO2019/058530
PCT Pub. Date: Mar. 28, 2019

(65) Prior Publication Data
US 2020/0214184 A1 Jul. 2, 2020

(51) Int. Cl.
*B23P 19/00* (2006.01)
*H05K 13/04* (2006.01)
(Continued)

(52) U.S. Cl.
CPC ......... *H05K 13/0452* (2013.01); *H05K 13/02* (2013.01); *H05K 13/0409* (2018.08); *H05K 13/0413* (2013.01); *H05K 13/0812* (2018.08)

(58) Field of Classification Search
CPC .......... H05K 13/0812; H05K 13/0813; H05K 13/082; H05K 13/0409; H05K 13/041; H05K 13/0417; H05K 13/0882
See application file for complete search history.

(56) References Cited

U.S. PATENT DOCUMENTS 8,196,294 B2 * 6/2012 Kino ................... H05K 13/0434
29/832
9,696,661 B1 * 7/2017 DeVore .............. G03G 15/1605
(Continued)

FOREIGN PATENT DOCUMENTS

EP    1 634 680 A1    3/2006
JP    2007-221035 A   8/2007
(Continued)

OTHER PUBLICATIONS

Extended European Search Report dated Jul. 31, 2020 in European Patent Application No. 17926140.9, 9 pages.
(Continued)

*Primary Examiner* — Paul D Kim
(74) *Attorney, Agent, or Firm* — Oblon, McClelland, Maier & Neustadt, L.L.P.

(57) ABSTRACT

A component mounting machine including a component supply device to supply a component to a supply position; a component transfer device to use a component mounting tool to pick up the component from the supply position and mount the component on a board; a component detecting section to detect whether the component is present at the supply position before or while the component is being picked up by the component mounting tool; a holding detecting section to detect whether the component mounting tool is holding the component following pickup; and a remaining detecting section to detect whether the component remains at the supply position in a case in which it is detected by the holding detecting section that the component
(Continued)

is not being held by the component mounting tool; and a dropped determining section to determine whether the component has dropped.

13 Claims, 6 Drawing Sheets

(51) Int. Cl.
*H05K 13/08* (2006.01)
*H05K 13/02* (2006.01)

(56) References Cited

U.S. PATENT DOCUMENTS

| | | | |
|---|---|---|---|
| 10,420,270 B2* | 9/2019 | Eguchi | H05K 13/0434 |
| 10,939,597 B2* | 3/2021 | Suzuki | H05K 13/0061 |
| 2006/0247813 A1 | 11/2006 | Takahashi | |
| 2015/0307288 A1* | 10/2015 | Sumi | B65G 47/917 |
| | | | 29/407.04 |
| 2017/0034968 A1* | 2/2017 | Yokoyama | H05K 13/0413 |
| 2019/0246530 A1* | 8/2019 | Kamio | H05K 13/0812 |

FOREIGN PATENT DOCUMENTS

| | | |
|---|---|---|
| JP | 2010-232544 A | 10/2010 |
| JP | 2015-95586 A | 5/2015 |

OTHER PUBLICATIONS

International Search Report dated Dec. 26, 2017 in PCT/JP2017/034378 filed on Sep. 22, 2017.

* cited by examiner

COMPONENT MOUNTING MACHINE AND METHOD FOR DETERMINING DROPPING OF COMPONENT

TECHNICAL FIELD

The present specification relates to a component mounting machine for performing a mounting operation for mounting electronic components (also referred to as components) on a board.

BACKGROUND ART

Technology for mass production of circuit boards by performing various operations (hereinafter referred to as board operations) for mounting components on a board on which printed wiring has been applied has become widespread. A solder printer, component mounter, reflow oven, board inspecting machine or the like is used as a board work machine for performing work with respect to a board. Component mounters generally include: a board conveyance device; component supply devices; and a component transfer device. A component transfer device includes: a mounting head for holding a suction nozzle; a head drive mechanism for horizontally driving the mounting head in two directions; and the like. When picking up components using a suction nozzle, there are rare cases in which a component is erroneously dropped. Patent literature 1 discloses an example of technology related to countermeasures for when there is a worry that a component will be dropped.

The component mounting machine of patent literature 1 is provided with: a detection device configured to detect that a component has been erroneously dropped when being picked up by a suction nozzle from a feeder device (component supply unit); and a control device configured to stop mounting operation when it is detected that a component has been dropped. Further, disclosed is a mode in which multiple pairs of light emitters and light receivers are arranged facing each other as the detection device, such that a dropped component is detected when the light is blocked. Accordingly, it is possible to prevent damage due to collisions between a suction nozzle and a dropped component.

CITATION LIST

Patent Literature

Patent Literature 1: JP-A-2010-232544

BRIEF SUMMARY OF INVENTION

Technical Problem

However, in patent literature 1, it is necessary to newly add the multiple pairs of light emitters and light receivers, which increases costs. Further, since mounting operation is always stopped when a dropped component is detected, production efficiency is lowered; if possible, it is desirable to continue mounting operation. Such problems are not limited to combinations of suction nozzle and feeder device, and other types of component mounting tools and other types of component supply devices need to be considered.

It is an object of the present disclosure to provide a component mounting machine capable of determining whether a component has dropped while curtailing increases in costs by using an existing machine configuration, and a method for determining whether a component has dropped.

Solution to Problem

Disclosed herein is a component mounting machine including: a component supply device configured to supply a component to a supply position; a component transfer device configured to use a component mounting tool to pick up the component from the supply position and mount the component on a board; a component detecting section configured to detect whether the component is present at the supply position before or while the component is being picked up by the component mounting tool; a holding detecting section configured to detect whether the component mounting tool is holding the component following pickup; and a remaining detecting section configured to detect whether the component remains at the supply position in a case in which it is detected by the holding detecting section that the component is not being held by the component mounting tool; and a dropped determining section configured to determine whether the component has dropped based on a detection result of the component detecting section, a detection result of the holding detecting section, and a detection result of the remaining detecting section.

Also disclosed herein is a component dropped determining method for determining whether a component has dropped at a component mounting machine including a component supply device configured to supply a component to a supply position, and a component transfer device configured to use a component mounting tool to pick up the component from the supply position and mount the component on a board, the component dropped determining method including: a component detecting process for detecting whether the component is present at the supply position before or while the component is being picked up by the component mounting tool; a holding detecting process for detecting whether the component mounting tool is holding the component following pickup; and a remaining detecting process for detecting whether the component remains at the supply position in a case in which it is detected by the holding detecting process that the component is not being held by the component mounting tool; and a dropped determining process for determining whether the component has dropped based on a detection result of the component detecting process, a detection result of the holding detecting process, and a detection result of the remaining detecting process.

Advantageous Effects

According to a component mounting machine disclosed in this specification, it is detected whether there is a component at the supply position before or after pickup operation using component mounting tool, and it is further detected whether the component mounting tool is holding the component, and it is determined whether the component has dropped. In other words, it is possible to tell indirectly and logically whether the component has dropped based on three detection results without directly detecting the dropped component. Further, the component detecting section, the holding detecting section, and the remaining detecting section are realized not by newly providing a sensor or the like, but by utilizing a conventional device configuration. Therefore, an increase in the cost required for the determination of the dropped component is curtailed. In addition, according to a dropped component determination method disclosed in this specification, the same effects as the above-described component mounting machine can be obtained.

DESCRIPTION OF EMBODIMENTS

1. Configuration of Component Mounting Machine 1 of a First Embodiment

Figure 1:
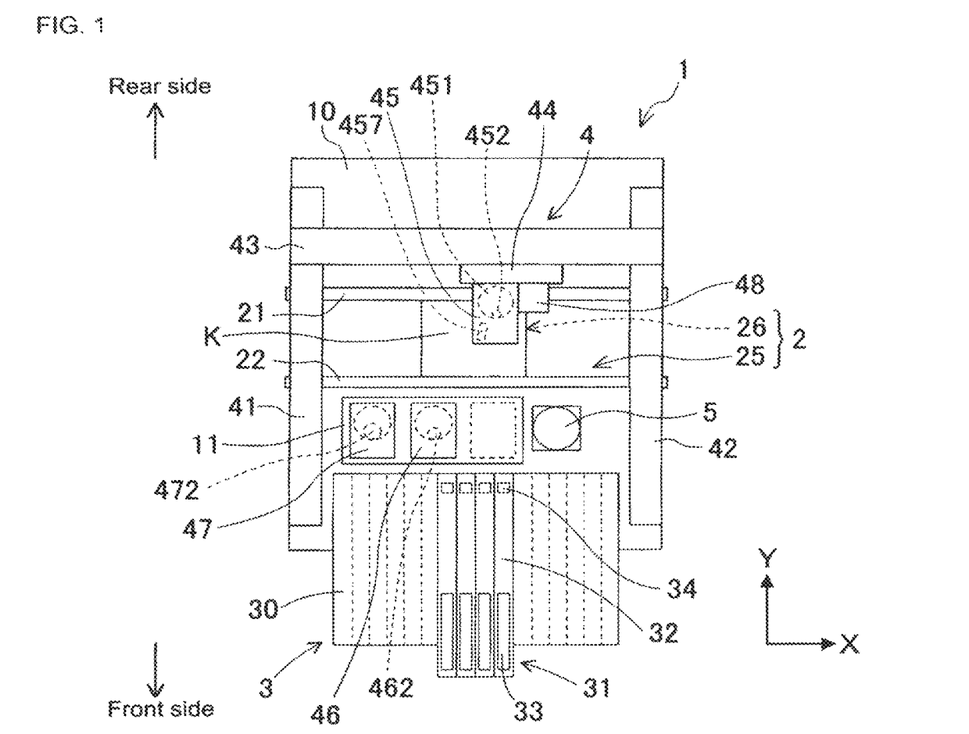
FIG. 1 is a plan view schematically showing the configuration of a component mounting machine of an embodiment.
Figure 2:
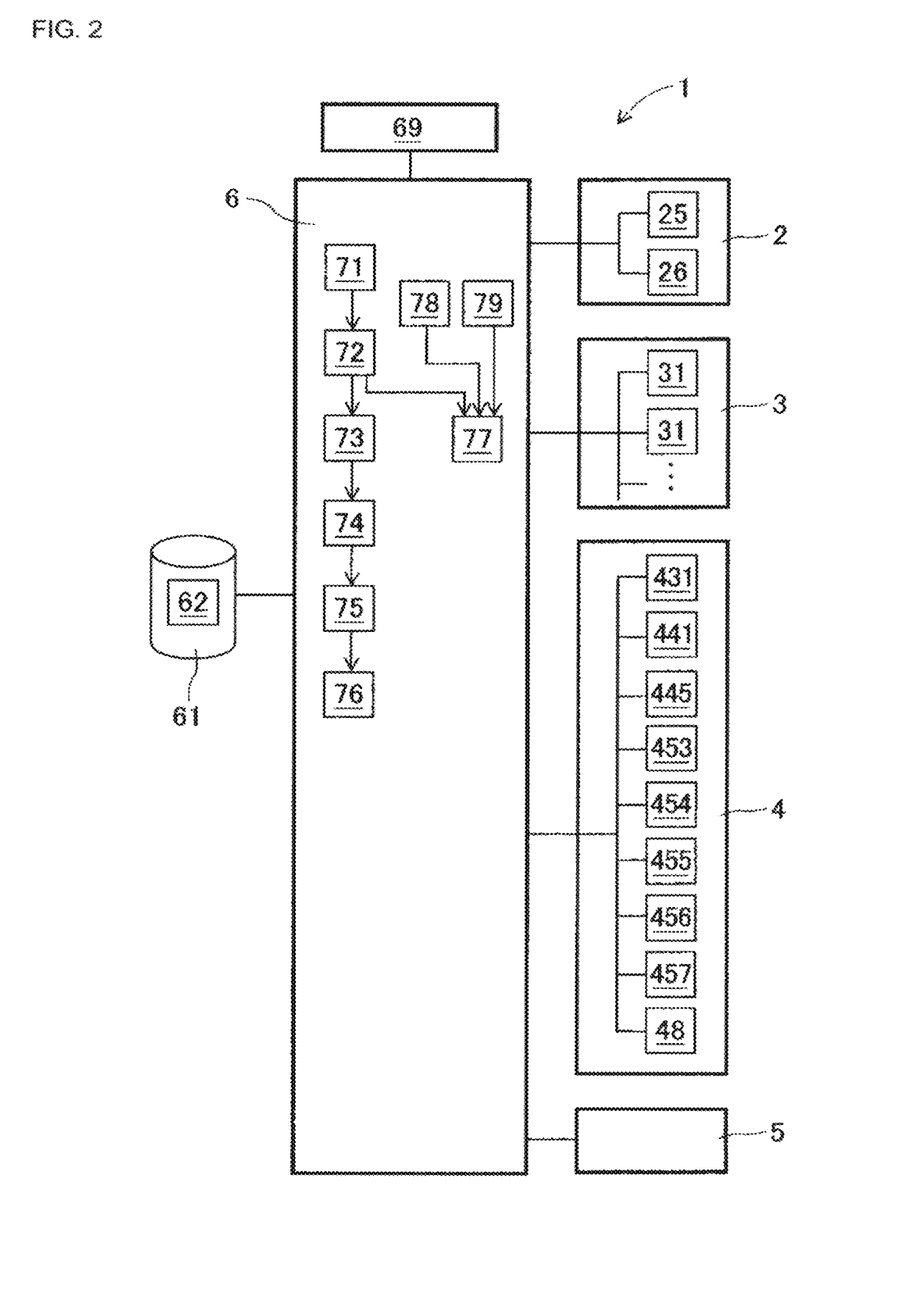
FIG. 2 is a block diagram showing the configuration of control items of the component mounting machine of the embodiment.

Component mounting machine 1 of an embodiment will be described with reference to FIGS. 1 to 8. FIG. 1 is a plan view schematically showing the configuration of component mounting machine 1 of an embodiment. The direction from the left side to the right side in FIG. 1 is the X-axis direction in which board K is conveyed, and a direction from the lower side to the upper side in FIG. 1 is the Y-axis direction (front-rear direction). FIG. 2 is a block diagram showing the configuration of control items of component mounting machine 1 of the embodiment. Component mounting machine 1 is configured from board conveyance device 2, component supply device 3, component transfer device 4, component camera 5, control device 6, and the like, assembled on base 10. Board conveyance device 2, component supply device 3, component transfer device 4, and component camera 5 are controlled from control device 6 such that each performs specified work.

Board conveyance device 2 performs board K conveyance work and positioning work. Board conveyance device 2 consists of conveyance unit 25 and backup unit 26. Conveyance unit 25 is configured from items such as pair of guide rails 21 and 22, and a pair of conveyor belts. The pair of guide rails 21 and 22 extend in the X-axis direction in the center of the upper surface of base 10, and are arranged parallel to each other. A pair of endless conveyor belts, which are not shown, are arranged facing each other on the inside of the pair of guide rails 21 and 22. The pair of conveyor belts revolve with the lengthwise edges of board K loaded on the conveyor belts and load and unload board K to and from a mounting position set at a center section of base 10. Backup unit 26 is arranged below the mounting position. Backup unit 26 pushes up board K and clamps it horizontally to position it at the mounting position. As a result, component transfer device 4 can perform the mounting operation.

Component supply device 3 performs supply of components. Component supply device 3 includes items such as pallet 30 and multiple feeder devices 31. Pallet 30 has a generally rectangular plate shape, and is detachably mounted on the front side of the upper surface of base 10. Feeder devices 31 are formed to be thin in the widthwise direction, and are mounted side by side on pallet 30. In FIG. 1, four feeder devices 31 are shown, but in reality many feeder devices 31 are lined up. In order to change the type of components to be supplied in accordance with the type of board K to be produced, feeder devices 31 are appropriately exchanged or the entire component supply device 3 is exchanged.

Figure 3:
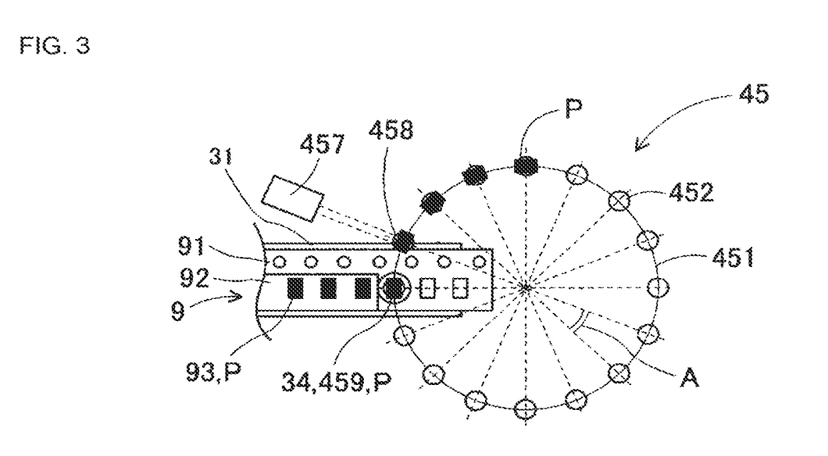
FIG. 3 is a plan view schematically showing a feeder device and a small mounting head of a component transfer device, and illustrating a state during component pickup operation.

The feeder device 31 is configured from main body section 32, tape reel 33 that is interchangeably set on the front side of main body section 32, and the like. Supply position 34 is set at an upper portion near the rear end of main body section 32. Carrier tape 9 (see FIG. 3) serving as component supply media is wound and held on tape reel 33. FIG. 3 is a plan view schematically showing a feeder device and a small mounting head of a component transfer device, and illustrating a state during component pickup operation. Components P are shown in black in FIG. 3.

As shown in FIG. 3, carrier tape 9 includes bottom tape 91, and cover tape 92 attached to bottom tape 91. Bottom tape 91 is made of paper or plastic, and cavity sections 93 for accommodating component P are formed at a regular pitch. Cover tape 92 is made of a transparent film or the like, and covers cavity sections 93. Feeder device 31 moves cavity sections 93 sequentially to supply position 34 by feeding carrier tape 9 one pitch at a time. Here, cover tape 92 is separated from bottom tape 91 and folded by a peeling device, which is not shown. As a result, component P can be picked up from cavity section 93 of supply position 34.

Component transfer device 4 performs component mounting operation. Component transfer device 4 is an XY robot type device that is capable of moving horizontally in the X-axis direction and the Y-axis direction. Component transfer device 4 includes pair of Y-axis rails 41 and 42, Y-axis slider 43, X-axis slider 44, multiple types of selectively attachable mounting head (45 to 47), board camera 48, and the like. The pair of Y-axis rails 41 and 42 are provided at the edges of base 10 and extend in the Y-axis direction. Y-axis slider 43 is movably mounted on Y-axis rails 41 and 42. Y-axis slider 43 is moved in the Y-axis direction by Y-axis ball screw mechanism 431.

X-axis slider 44 is movably mounted on Y-axis slider 43. X-axis slider 44 is moved in the X-axis direction by X-axis ball screw mechanism 441. X-axis slider 44 includes head raising and lowering device 445 for raising and lowering a mounting head (45 to 47) with respect to X-axis slider 44. As the multiple types of mounting heads 45 to 47, small mounting head 45, medium-sized mounting head 46, and large mounting head 47 are used. These mounting heads (45 to 47) are arranged lined up in head exchange station 11 on machine base 10. Further, the mounting head (45 to 47) is driven to move up and down by head raising and lowering device 445, and the mounting head (45 to 47) is automatically exchanged. FIG. 1 illustrates an attachment state of selected small mounting head 45.

Small mounting head 45 includes items such as rotary tool 451, small suction nozzle 452, rotation drive section 453, raising and lowering drive section 454, internal pressure control section 455, negative pressure measuring sensor 456, and side view camera 457. Rotary tool 451 is rotatably held on the underside of small mounting head 45. Sixteen nozzle holders are arranged in a ring on rotary tool 451 at intervals of specified angle A. Each nozzle holder holds one of sixteen small suction nozzles 452 to be movable up and down via an elastic member. The sixteen small suction nozzles 452 are for mounting small component P.

When small mounting head 45 is driven above supply position 34 of any of the feeder devices 31, one nozzle holder and one small suction nozzle 452 are positioned at pickup position 459. As shown in FIG. 3, suction position 459 is a position directly above supply position 34 of feeder device 31. Raising and lowering drive section 454 drives the nozzle holder at pickup position 459 to move up and down. When small suction nozzle 452 at pickup position 459 is driven downward, internal pressure control section 455 supplies negative pressure to small suction nozzle 452.

As a result, small suction nozzle 452 at pickup position 459 descends to supply position 34 and picks up component P at a lower end opening section. Negative pressure measuring sensor 456 measures the negative pressure inside small suction nozzle 452 when small suction nozzle 452 is performing pickup operation. When the lower end opening section of small suction nozzle 452 comes into contact with component P, the intake of atmospheric air is blocked, and the negative pressure of small suction nozzle 452 is markedly lowered. If the component P is not present, the intake of atmosphere air is continued, such that the negative pressure of small suction nozzle 452 is not lowered much. Therefore, the presence or absence of component P is detected based on the measurement result of negative pressure measuring sensor 456. Negative pressure measuring sensor 456 functions as a portion of component detecting section 71 and remaining detecting section 73, which will be described later.

Upon the first small suction nozzle 452 picking up component P and being raised, rotary drive section 453 rotates rotary tool 451 clockwise by specified angle A (see FIG. 3). As a result, the first small suction nozzle 452 is rotationally moved from pickup position 459 and positioned at detection position 458. At the same time, the second small suction nozzle 452 next to the first small suction nozzle 452 is positioned at pickup position 459. Note that, the raising operation of the first small suction nozzle 452 and the rotation operation of rotary tool 451 may be performed in parallel.

Pickup operation of small suction nozzle 452 and rotation operation of rotary tool 451 are repeatedly performed. As a result, the sixteen or a portion of the sixteen of the small suction nozzles 452 pick up and hold a component P. FIG. 3 shows a state in which four small suction nozzles 452 have completed pickup of a component P, and the fifth small suction nozzle 452 is performing pickup of a component P. Rotation drive section 453 further has a function of driving rotary tool 451 to rotate counterclockwise in the opposite direction. According to this, small suction nozzle 452 can be returned from detection position 458 to pickup position 459 in a short time by a retry operation, which is described later.

Side view camera 457 is provided at a position where the vicinity of the lower end opening section of first small suction nozzle 452 positioned at detection position 458 can be imaged. Side view camera 457 is a captured image processing section for capturing an image of the first small suction nozzle 452 from the side and performing image processing on the acquired image data to detect whether the first small suction nozzle 452 is holding a component P. Side view camera 457 functions as a portion of holding detecting section 72 to be described later. Further, when small mounting head 45 is driven above board K, small suction nozzle 452 at pickup position 459 is driven downward by raising and lowering drive section 454, and positive pressure is supplied from internal pressure control section 455 to mount the component P on board K.

Medium-sized mounting head 46 and large mounting head 47 are similar in construction to small mounting head 45. However, medium-sized mounting head 46 has four medium-sized suction nozzles 462. Medium-sized suction nozzles 462 are for mounting medium-sized components P. Large mounting head 47 has two large suction nozzles 472. Large suction nozzles 472 are for mounting large components P.

As described above, the combinations of the mounting head (45, 46, 47), the suction nozzle (452, 462, 472), and the component P correspond to each other in terms of small size, medium size, and large size. As a result, description of following operations and the like is simplified for clarity. Actually, there are various sizes of components P, and there are often more than three types of mounting heads (45, 46, 47) or suction nozzles (452, 462, 472). In addition, there are also variations and usage modes such as a configuration in which only the suction nozzle (452, 462, 472) is exchanged without exchanging the mounting head (45, 46, 47).

Board camera 48 is arranged facing downward at a position next to the mounting head (45, 46, 47) of X-axis slider 44. Board camera 48 images position reference marks provided on board K to detect an accurate position of board K. Board camera 48 can also function as a portion of component detecting section 71 and remaining detecting section 73, which will be described later.

Component transfer device 4 performs mounting operation by repeating the pickup and mounting cycle (hereinafter referred to as the PP cycle). To describe operation of the PP cycle in detail, first, component transfer device 4 moves the mounting head (45, 46, 47) to component supply device 3, and picks up components P using the multiple suction nozzles (452, 462, 472), respectively. Component transfer device 4 then moves the mounting head (45, 46, 47) above component camera 5. Here, the holding states of the multiple components P are imaged by component camera 5. Component transfer device 4 then moves the mounting head (45, 46, 47) to board K to mount the components P, then returns to component supply device 3.

Small mounting head 45, medium-sized mounting head 46, and large mounting head 47 are exchanged automatically in accordance with the size of the component P to be mounted on board K. For example, when small and large components P are to be mounted on a certain type of board K, small mounting head 45 and large mounting head 47 are automatically exchanged during the mounting operation to that board K. As a typical mounting order, several PP cycles of small mounting head 45 are performed first, then PP cycles of medium-sized mounting head 46, and finally PP cycles of large mounting head 47. However, depending on the type of board K or components P, there are exceptions to the mounting order.

Figure 4:
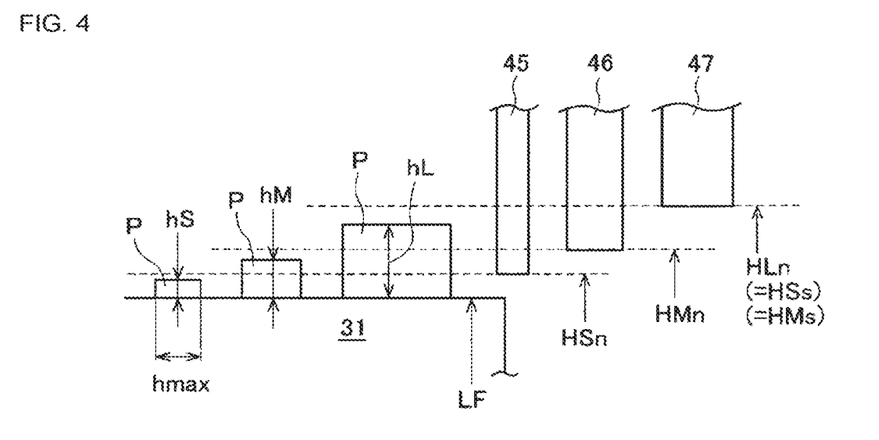
FIG. 4 schematically illustrates heights at which three types of mounting head move in a horizontal direction.

Heights at which small mounting head 45, medium-sized mounting head 46, and large mounting head 47 move horizontally will be described. FIG. 4 schematically illustrates heights at which three types of mounting head (45, 46, 47) move in a horizontal direction. In FIG. 4, height level LF represents the height of the upper surface of feeder device 31. Components P that are accidentally dropped during the pickup operation often end up on the upper surface of feeder device 31. In this case, the mounting head (45, 46, 47) may interfere with the dropped component P when moving and may be damaged. In addition, components P picked up by the suction nozzles (452, 462, 472) may collide with a dropped component P.

Thus, normal height HSn at which the lower end portion of small mounting head 45 moves horizontally is set slightly higher than the height obtained by considering height dimension hS of small component P. With many configurations of small mounting head 45, the bottom surface of the component P held by small suction nozzle 452 is a lower end portion, but the configuration is not limited to this. Note that, instead of the height dimension hS of small component P in the mounting orientation, the long-side dimension hmax of the component P may be considered. According to this, even if the dropped part P is in an upright state, there is no risk of interference, and the reliability is further enhanced.

In addition, normal height HMn of medium-sized mounting head 46 is set slightly higher than the height of the medium-sized component P considering height dimension hM. In addition, normal height HLn of large mounting head 47 is set slightly higher than the height of the large component P considering height dimension hL. The setting of the normal heights (HSn, HMn, HLn) is performed in conjunction with the automatic exchange of the mounting head (45, 46, 47).

By setting the normal heights (HSn, HMn, HLn), in a case in which the mounting head (45, 46, 47) is not automatically exchanged during mounting operation, the mounting head (45, 46, 47) and the dropped component P are prevented from interfering with each other. However, in a case in which the mounting head (45, 46, 47) is automatically exchanged, the risk of interference is not eliminated. For example, when small mounting head 45 moves at normal height HSn, it interferes with a dropped medium-sized or large component P. Also, for example, medium-sized mounting head 46 interferes with a large dropped component P when moving at normal height HMn.

Therefore, retraction height HSs is set for small mounting head 45, and retraction height HMs is set for medium-sized mounting head 46. Retraction height HSs and retraction height HMs are heights at which the risk of interference can be eliminated regardless of the size of the dropped component P. In the present embodiment, retraction height HSs and retraction height HMs are set equal to normal height HLn of large mounting head 47. Further, with respect to large mounting head 47, since there is no risk of interference at normal height HLn, a retraction height is not set. Note that, retraction control section 75, which will be described later, may variably set the retraction height considering the size of the dropped component P. The normal height (HSn, HMn, HLn) and the retraction height (HSs, HMs) are switched by retraction control section 75 controlling head raising and lowering device 445.

Component camera 5 is provided facing upwards on an upper surface of machine base 10 between board conveyance device 2 and component supply device 3. While the mounting head (45, 46, 47) moves from component supply device 3 to board K, component camera 5 images the state of the component P held by the suction nozzle (452, 462, 472). When an error in the holding state or a shift in the rotational angle of the component P is found by the image processing of the acquired captured image data, control device 6 finely adjusts the mounting operation as required, and when the mounting operation is difficult, performs control to discard the component P.

2. Configuration and Control Functions of Component Mounting Machine 1 of the Embodiment Next, the configuration and control functions of component mounting machine 1 according to the embodiment will be described. Control device 6 is assembled on base 10, but the arrangement position is not particularly restricted. Control device 6 is a computer device with a CPU that runs software. As shown in FIG. 2, control device 6 holds mounting sequences 62 in memory section 61. Mounting sequence 62 is data specifying the type of components P to be mounted on board K, the mounting coordinate positions, the mounting order, feeder devices 31 for supplying the components, and the like.

Control device 6 controls the operation flow of component mounting machine 1 according to mounting sequence 62. Also, control device 6 sequentially collects and updates operating data such as production quantity of completed boards K, mounting time required to mount components P, and occurrences of component P pickup errors. Control device 6 is communicatively connected to host computer 69, which is an upper level control device, and communicates and receives commands, responses, and the like.

Further, control device 6 performs control relating to determination of dropped components P and control relating to a retry operation when a component P cannot be picked up. Control device 6 has component detecting section 71 and holding detecting section 72 as functional units relating to both the dropped determination and the retry operation. Control device 6 includes remaining detecting section 73, dropped determining section 74, retraction control section 75, and retraction operation notification section 76 as functional units relating to the dropped determination. Control device 6 includes retry performing section 77, countermeasure setting section 78, and component type registration section 79 as functional units related to the retry operation.

Component detecting section 71 detects whether a component P is present at supply position 34 of feeder device 31 when the component P is picked up by using a suction nozzle (452, 462, 472). In the present embodiment, component detecting section 71 uses negative pressure measuring sensor 456 described above to detect whether a component P is present in cavity section 93 located at supply position 34. The configuration of component detecting section 71 is not limited to this, there are various other possible aspects.

For example, component detecting section 71 may include a height measuring sensor that measures the relative height of the suction nozzle (452, 462, 472) to the nozzle holder and detects that the suction nozzle (452, 462, 472) is in contact with the component P. In detail, when the suction nozzle (452, 462, 472) comes into contact with component P while the nozzle holder is being lowered, it will not lower further, and only the lowering of the nozzle holder will continue. This changes the relative height of the suction nozzle (452, 462, 472) to the nozzle holder. Therefore, the height measuring sensor can detect the presence of component P by the change in the relative height.

An example of a height measuring sensor is a light blocking type sensor provided on the nozzle holder. The light blocking type sensor detects a variation in the relative height by detecting a light blocking portion attached at a specific height of the suction nozzle (452, 462, 472). Further, component detecting section 71 may image cavity section 93 using board camera 48 before picking up the component P, and may detect the presence or absence of component P by performing image processing on the acquired image data.

Holding detecting section 72 detects whether the suction nozzle (452, 462, 472) picks up and is holding component P. For example, when small mounting head 45 is attached, holding detecting section 72 detects whether small suction nozzle 452 positioned at detection position 458 is holding a component P by using side view camera 457 described above.

When holding detecting section 72 detects that the suction nozzle (452, 462, 472) is not holding a component P, remaining detecting section 73 detects whether a component P remains at supply position 34. Remaining detecting section 73 also serves as component detecting section 71, and operates in the same manner as component detecting section 71. Actually, the detection result of the "presence/absence of component P" of component detecting section 71 is reused as the detection result for "remaining/not remaining of component P" of remaining detecting section 73.

Dropped determining section 74 determines whether component P has dropped based on the detection result of component detecting section 71, the detection result of holding detecting section 72, and the detection result of remaining detecting section 73. Specifically, when component detecting section 71 detects that a component P is at supply position 34, holding detecting section 72 detects that the suction nozzle (452, 462, 472) is not holding component P, and remaining detecting section 73 detects that component P is not remaining at supply position 34, dropped determining section 74 determines that the component P has dropped. That is, when the component P at supply position 34 is not picked up and the suction nozzle (452, 462, 472) is not holding component P, it can be logically determined that component P has dropped erroneously. The result of the determination as to whether component P has dropped is delivered to retraction control section 75.

Note that, for component detecting section 71, holding detecting section 72, remaining detecting section 73, and dropped determining section 74 a component P of a specified size or greater is a drop determination target. Specifically, medium-sized and large components P are targets for dropped determination, and small components P, which do not interfere even if they drop, are excluded as targets. As a result, the time required for detection and determination is reduced, and production efficiency is improved.

For example, when component detecting section 71 includes a height measuring sensor, the nozzle holder is lowered to a position lower than the normal position in order to manifest a change in the relative height. For small components P that are not subject to detection, the nozzle holder need only be lowered to the normal position, thereby reducing the time required for detection. Further, when component detecting section 71 includes board camera 48, it is possible to reduce the time required to image cavity section 93 in which the small component P is accommodated and perform image processing.

Retraction control section 75 controls retraction operation of moving the mounting head (45, 46) at the retraction height (HSs, HMs) when it is determined by dropped determining section 74 that the component P has dropped. Further, retraction control section 75 determines whether retraction operation is necessary based on at least one of the type of the suction nozzle (452, 462, 472), the type of the mounting head (45, 46, 47), the size of the dropped component P, and the size of the component P to be picked up.

Thanks to the retraction operation, even if component P is dropped, production of board K is continued. However, the production efficiency is lowered by using the retraction heights (HSs, HMs), which are higher than the normal heights (HSn, HMn). In addition, leaving the dropped part P in its dropped position is not desirable. Therefore, retraction operation notification section 76 notifies at least one of host computer 69 or an operator of the control state of retraction control section 75. With this notification, countermeasures can be performed quickly such that the dropped component P is collected, and high production efficiency at the normal heights (HSn and HMn) can be restored.

Based on the detection result of component detecting section 71 and the detection result of holding detecting section 72, retry performing section 77 determines whether to perform a retry operation for picking up the component P again using the suction nozzle (452, 462, 472). Further, retry performing section 77 performs the retry operation in accordance with the determination result.

Specifically, when component detecting section 71 detects that component P is present at supply position 34 and holding detecting section 72 detects that the suction nozzle (452, 462, 472) is not holding component P, retry performing section 77 performs a retry operation on the cavity section 93 that is the same as the cavity section 93 from the first pickup operation. Further, in a case in which component P cannot be picked up by one retry operation, retry operation section 77 performs retry operation specified number of times N.

Countermeasure method setting section 78 presets a countermeasure method for when the suction nozzle (452, 462, 472) cannot pick up component P even if retry performing section 77 performs the retry operation, that is, when the retry operation is unsuccessful. Examples of countermeasures include skipping, alerting, and stopping errors. With skipping, mounting operation is completed without mounting the component P, and the history of the skip is recorded. With the alert, a warning is issued while mounting operation of other components P proceeds. In the case of the error stop, mounting operation is interrupted to notify the occurrence of the error, and the machine stands by for an operator to perform countermeasures.

Component type registration section 79 registers in advance the types of component P that are targets for retry operation. Usually, an expensive component P or a component P having a small inventory amount and a long procurement time is registered as a target for retry operation. As a result, the disposal rate of expensive components P is reduced, and the labor of collecting expensive components P that have not been mounted is omitted. On the other hand, for inexpensive components P, shifting to pickup operation of the next component P without performing retry operation is performed, such that a decrease in production efficiency is suppressed. Further, with respect to components P whose inventory amount is small, the risk of falling into an inventory shortage is reduced.

3. Operation of Component Mounting Machine 1 of the Embodiment

Figure 5:
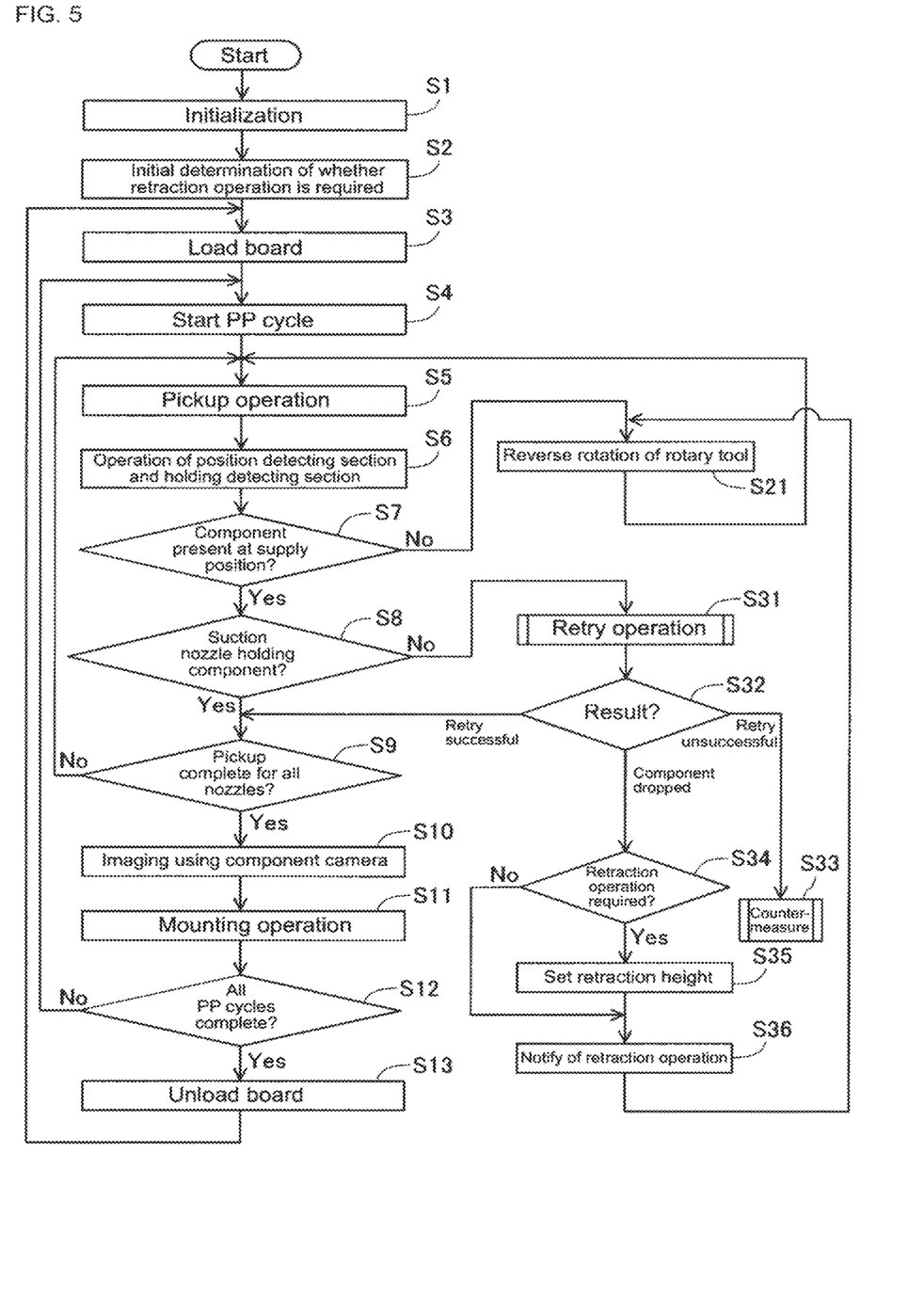
FIG. 5 is a flowchart showing a main operation flow of a control device that controls component mounting operation.
Figure 6:
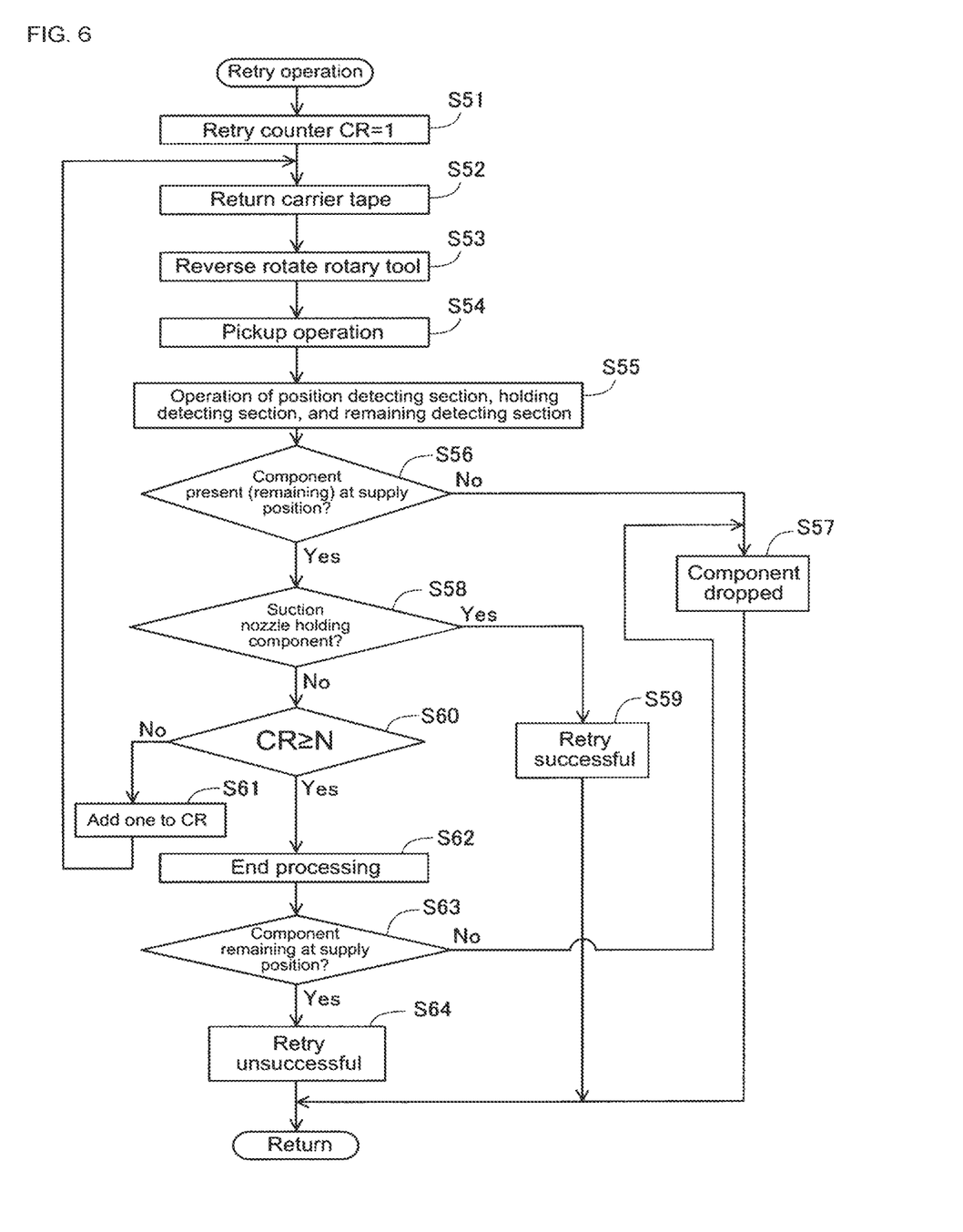
FIG. 6 is a flowchart showing a detailed operation flow of retry operation that is included in FIG. 5.

Next, the operation of component mounting machine 1 of the embodiment will be described. FIG. 5 is a flowchart showing a main operation flow of control device 6 that controls component P mounting operation. The operation flow of FIG. 5 is performed for each type of board K to be produced. FIG. 6 is a flowchart showing a detailed operation flow of retry operation that is included in FIG. 5.

In step S1 of FIG. 5, control device 6 performs initialization. Specifically, retraction control section 75 of control device 6 sets the normal heights (HSn, HMn, HLn) for when the mounting head (45, 46, 47) moves. Component type registration section 79 registers in advance the types of component P that are targets for retry operation. For example, in the case where information as to whether the component P is a target of retry operation is given in the component data, component type registration section 79 can search for the component data and perform registration. Alternatively, component type registration section 79 can perform registration based on an input operation by an operator. On the other hand, management method setting section 78 presets a handling method for when the retry operation is unsuccessful.

In step S2, retraction control section 75 performs an initial determination of whether retraction operation is required. For example, when components P to be mounted on a certain type of board K are only large and only large mounting head 47 having large suction nozzle 472 is used, the retraction operation is not necessary. Also, for example, when only small components P are to be mounted using small mounting head 45 having small suction nozzle 452, the retraction operation is not necessary. On the other hand, when the mounting head (45, 46, 47) is automatically exchanged in the middle of the mounting operation, there is a fear that the component P may cause interference by being dropped, such that the possibility of retraction operation needs to be considered. Actually, there are various sizes of components P, and the determination logic of the initial determination is complicated to some extent. Retraction control section 75 resets the retraction flag when the retraction operation is not necessary, and sets the retraction flag when the saving operation is considered.

In step S3, control device 6 controls board conveyance device 2 to load and position the board K. In step S4, control device 6 controls component supply device 3 and component transfer device 4 to start the mounting operation of component P, that is, the PP cycle. In step S5, control device 6 causes component transfer device 4 to perform pickup operation of component P using the suction nozzle (452, 462, 472). Immediately after pickup operation, component transfer device 4 rotates rotary tool 451 clockwise by specified angle A. Feeder device 31 moves cavity sections 93 sequentially to supply position 34 by feeding carrier tape 9 one pitch at a time.

In step S6, component detecting section 71 and holding detecting section 72 operate. In step S7, dropped determining section 74 and retry performing section 77 confirm the detection result of the component detecting section 71, that is, whether the component P is present in cavity section 93 of supply position 34. Normally, there is a component P at supply position 34 and performing of the operational flow proceeds to step S8. In step S8, dropped determining section 74 and retry performing section 77 confirm the result of detecting the holding detecting section 72, that is, whether the suction nozzle (452, 462, 472) is holding the component P. Normally, component P is being held, and performing of the operation flow proceeds to step S9.

In step S9, control device 6 determines whether pickup operation of all the suction nozzles (452, 462, 472) has been completed. If not, control device 6 returns the operation flow to S5 for the next suction nozzle (452, 462, 472). By repeating the loop from step S5 to step S9, pickup operation of all the suction nozzles (452, 462, 472) is completed. Then, control device 6 proceeds to step S10 to continue the operation flow. Note that, of the content of the PP cycles in mounting sequence 62, only a portion of the suction nozzles (452, 462, 472) may be used.

In step S10, component transfer device 4 moves the mounting head (45, 46, 47) above component camera 5. Thus, imaging by component camera 5 is performed. In step S11, component transfer device 4 moves the mounting head (45, 46, 47) to board K to perform the mounting operation of components P. In step S12, control device 6 determines whether all the PP cycles have been completed. If not, control device 6 returns to step S4 to execute the operation flow for the subsequent PP cycle. By repeating the loop from step S4 to step S12, all the PP cycles are completed. Then, control device 6 proceeds to step S13 to continue the operation flow.

In step S13, control device 6 unloads the board K that has been produced. Then, control device 6 returns the operation flow to step S3, and starts the mounting operation for the next board K. By repeating the loop from step S3 to step S13, board K is mass-produced. Note that, unloading of the completed board K and loading of the next board K may be performed simultaneously. Up to this point, the main operation flow has been described without any problems occurring.

In step S7, when there is no component P at supply position 34, the operation flow branches to step S21. In this case, a component P is not accommodated in cavity section 93 of carrier tape 9 initially. In detail, several cavity sections near the leading end and the trailing end of carrier tape 9 are empty cavity section in which components are not accommodated initially. Empty cavity sections are cut by the operator or stored in advance in control device 6 such that pickup operation can be omitted for the empty cavities. Nevertheless, due to an incomplete cutting operation by the operator or an error in the number of empty cavity sections, there is a possibility that an empty cavity section is judged to be a normal cavity section 93, meaning that pickup operation is performed. In addition, although rare, there may be normal cavities that do not house a component.

In step S21, control device 6 rotates rotary tool 451 counterclockwise, which is an opposite direction, by specified angle A, and returns the operation flow to step S5. In step S5, component transfer device 4 uses the suction nozzle (452, 462, 472) that did not pick up the component P, and performs pickup operation from the next cavity section 93 in carrier tape 9.

Figure 7:
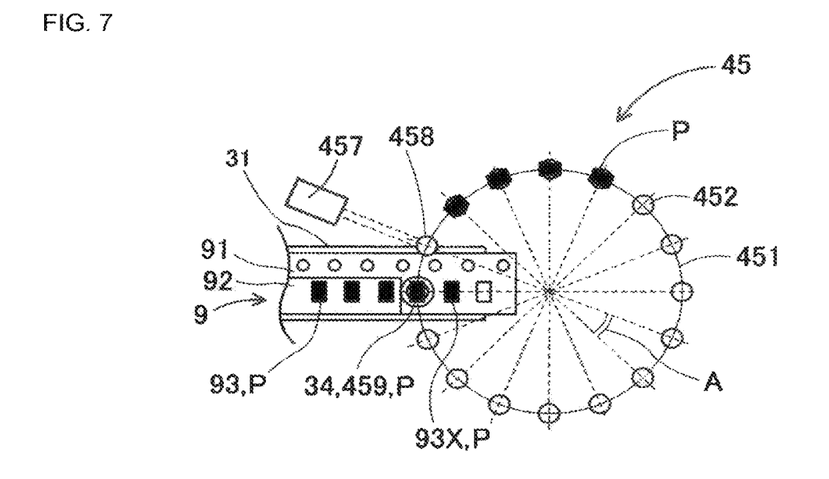
FIG. 7 is a plan view showing a first case of a situation in which one pickup operation has been completed from the state shown in FIG. 3 but the small suction nozzle is not holding a component.
Figure 8:
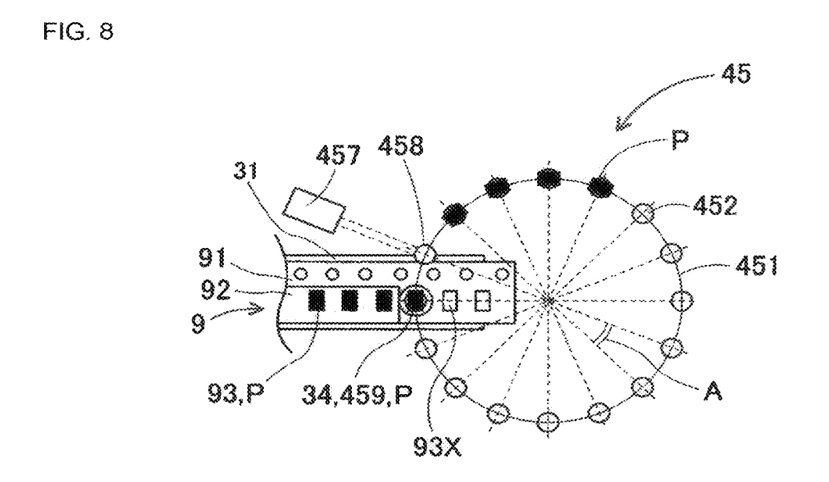
FIG. 8 is a plan view showing a second case of a situation in which one pickup operation has been completed from the state shown in FIG. 3 but the small suction nozzle is not holding a component.

Further, in step S8, in a case in which the suction nozzle (452, 462, 472) is not holding a component, the operation flow branches to step S31. Two cases are assumed here, as illustrated in FIGS. 7 and 8. FIG. 7 is a plan view showing a first case of a situation in which one pickup operation has been completed from the state shown in FIG. 3 but small suction nozzle 452 is not holding a component P. FIG. 8 is a plan view showing a second case of a situation in which one pickup operation has been completed from the state shown in FIG. 3 but the small suction nozzle 452 is not holding a component.

In FIG. 7, from the situation of FIG. 3, rotary tool 451 is rotated clockwise by specified angle A such that the fifth small suction nozzle 452 is positioned at detection position 458. In step S6, side view camera 457 captures an image of the condition in which the fifth small suction nozzle 452 is not holding a component P. Thus, branching from step S8 to step S31 is performed. On the other hand, carrier tape 9 is advanced by a predetermined pitch from the situation of FIG. 3. Further, a component P remains in cavity section 93X advanced from supply position 34. Therefore, in the first case, a component P is present in cavity section 93X during the pickup operation, but the component P could not be picked up small suction nozzle 452.

On the other hand, in FIG. 8, the rotational driving of rotary tool 451 and the feeding of carrier tape 9 at a predetermined pitch are the same as those in FIG. 7. However, there is no component P present in cavity section 93X advanced from supply position 34. Therefore, in the second case, a component P is present in cavity section 93X during the pickup operation, but when the component P is picked up by small suction nozzle 452, the component P is erroneously dropped. At the present time, control device 6 cannot discriminate between the first case shown in FIG. 7 and the second case shown in FIG. 8.

In step S31, retry performing section 77 of control device 6 performs a retry operation regardless of whether the first case or the second case applies. In step S51 of FIG. 6 showing the details of the retry operation, retry performing section 77 sets the retry counter RC for counting the number of retries to one. In step S52, retry performing section 77 returns the carrier tape 9 by a predetermined pitch, and repositions the cavity 93X, for which it is unknown whether a component P remains, at supply position 34. In step S53, retry performing section 77 rotates rotary tool 451 counterclockwise by specified angle A to reposition the fifth small suction nozzle 452 at pickup position 459.

By these operations, for the first case, the situation of FIG. 3 is reproduced. Further, for the second case, the condition of FIG. 3 is reproduced except that a component P is not present in cavity section 93X. In step S54, retry performing section 77 causes component transfer device 4 to perform the same pickup operation as in step S5. As described above, rotary tool 451 is rotationally driven and carrier tape 9 is fed in accordance with the pickup operation. In step S55, component detecting section 71, holding detecting section 72, and remaining detecting section 73 are operated.

In step S56, dropped determining section 74 and retry performing section 77 determine the branch destination of the operation flow based on the detection results of component detecting section 71 and remaining detecting section 73. If there is no component P (there is no component remaining), in step S57, dropped determining section 74 determines that the second case is "component dropped". Then, dropped determining section 74 returns control to the main operation flow.

On the other hand, if there is a component P (there is a component remaining), in step S58, retry performing section 77 determines the branch destination of the operation flow based on the detection result of holding detecting section 72. If there is a component P being held by the suction nozzle (452, 462, 472), in step S59, retry performing section 77 determines "retry successful" after the first case. Then, retry performing section 77 returns control to the main operation flow.

If a component P is not being held by the suction nozzle (452, 462, 472), in step S60, retry performing section 77 determines whether the value of retry counter RC has reached specified number of times N. If not, in step S61, retry performing section 77 adds one to retry counter RC and returns the operation flow to step S52. By repeating the loop from step S52 to step S61, the pickup operation of step S54 is performed a specified number of times at maximum.

In the middle of repeating the loop, a branch to step S57 or step S59 may occur. Further, if a branch to step S57 or step S59 does not occur, the value of retry counter RC will reaches the specified number of times N in step S60, and the operation flow will proceed to step S62.

In step S62, retry performing section 77 controls the performing of end processing. End processing is not intended for picking up component P, but is intended to finally confirm whether component P remains. Specifically, retry performing section 77 weakens the negative pressure supplied from internal pressure control section 455 to the suction nozzle (452, 462, 472) to perform pickup operation. Note that, in a configuration in which remaining detecting section 73 includes a height measuring sensor, only the lowering operation is performed, without supplying negative pressure to the suction nozzle (452, 462, 472).

In step S63, retry performing section 77 determines the branch destination of the operation flow based on a detection result of remaining detecting section 73 in the end processing. If a component P does not remain, retry performing section 77 merges the operation flow with the "dropped component" of S57. Further, if a component P remains, in step S64, retry performing section 77 determines "retry unsuccessful" after the first case. Then, retry performing section 77 returns control to the main operation flow. The "retry unsuccessful" occurs in cases such as when the component P is fixed to cavity section 93X, when cover tape 92 covering cavity section 93X is not peeled off, or the like.

Eventually, the result of the retry operation is either "retry successful", "retry unsuccessful", or "dropped component". Returning to step S32 of FIG. 5, retry performing section 77 determines the branch destination of the operation flow in accordance with the result of the retry operation. In the case of "retry successful", retry performing section 77 returns the execution of the operation flow to step S9. In a case of "retry unsuccessful", in step S33, control device performs the countermeasure method initially set in step S1.

In the case of "dropped component", in step S34, retraction control section 75 determines whether retraction operation is required and appropriately branches the operation flow. Specifically, if the retraction flag was reset in step S2, retraction control section 75 can immediately determine that retraction operation is not necessary. Further, if the retraction flag has been set, control section 75 compares the size of the component P actually dropped with the type of the mounting head (45, 46, 47) to be used to determine whether retraction operation is necessary.

For example, if the dropped component P is large, retraction operation of small mounting head 45 and medium-sized mounting head 46 is required, as is apparent from FIG. 4 and related descriptions. Further, if the dropped component P is medium sized, retraction operation is required for small mounting head 45. If the dropped component P is small, retraction operation is unnecessary.

If retraction operation is required, in step S35, retraction control section 75, for a large dropped component P, sets retraction height HSs for small mounting head 45 and sets retraction height HMs for medium-sized mounting head 46. Further, when the dropped component P is medium sized, retraction control section 75 sets only retraction height HSs for small mounting head 45. Note that, when multiple components P drop due to a repeat of the operation flow, retraction control section 75 performs setting considering the largest of the dropped components P.

In the step S36, retraction operation notification section 76 notifies the control execution state of the retraction operation. Further, if retraction operation is not required in step S34, retraction control section 75 omits step S35 and proceeds the operation flow to step S36. In this case, in step S36, retraction operation notification section 76 issues a notice that a small component P has been dropped. After the performing of step S36, retraction control section 75 merges the operation flow with step S21.

The retraction height (HSs, HMs) set in S35 is continuously used until a predetermined number of boards K have been produced. However, when an operator performs dropped component P countermeasure work and subsequently restarts processing, the retraction height (HSs, HMs) is returned to the normal height (HSn, HMn).

According to component mounting machine 1 of the embodiment, it is possible to indirectly and logically determine whether component P has dropped based on the detection results of component detecting section 71, holding detecting section 72, and remaining detecting section 73, without directly detecting the dropped component P. Further, component detecting section 71, holding detecting section 72, and remaining detecting section 73 are realized not by newly providing a sensor or the like, but by utilizing a conventional device configuration. Therefore, an increase in the cost required for the determination of the dropped component is curtailed.

Further, according to component mounting machine 1 of the embodiment, it is detected whether there is a component P at supply position 34 when the component P is picked up using the suction nozzle (452, 462, 472), it is further detected whether the suction nozzle (452, 462, 472) is holding a component P, and it is determined whether to perform the retry operation based on the detection results. Therefore, when there is no component P at supply position 34 from the beginning, a meaningless retry operation can be avoided.

4. Applications and Alternative Embodiments

Note that, control device 6 may perform only one of the control relating to the dropped determination of the component P and the control relating to the retry operation when the component P cannot be picked up. Further, in an embodiment above, component supply device 3 is configured from feeder device 31 and a suction nozzle (452, 462, 472) is used as a component mounting tool, but the configuration is not limited to this. That is, component supply device 3 may be a device using a tray as a component supplying medium or a component supply device of another type. As the component mounting tool, a clamping type mounting tool that clamps component P can also be used.

Further, although the multiple mounting heads (45 to 47) are automatically exchanged in an embodiment above, the mounting head (45 to 47) may be manually exchanged or the mounting head may not be exchanged. Further, detection operation (step S55 in FIG. 6) of component detecting section 71, holding detecting section 72, and remaining detecting section 73 during retry operation may be performed differently from the detection operation (step S6 in FIG. 5) for normal operation. Various other variations and applications of the embodiments are possible.

REFERENCE SIGNS LIST

1: component mounter;
2: board conveyance device;
3: component supply device;
31: feeder device;
34: supply position;
4: component transfer device;
45: small mounting head;
451: rotary tool;
452: small suction nozzle;
453: rotation drive section;
454: raising and lowering drive section;
456: negative pressure measuring sensor;
457: side view camera;
458: detection position;
459: pickup position;
46: medium-sized mounting head;
462: medium-sized suction nozzle;
47: large mounting head;
472: large suction nozzle;
6: control device;
71: component detecting section;
72: holding detecting section;
73: remaining detecting section;
74: dropped determining section;
75: retraction control section;
76: retraction operation notification section;
77: retry performing section;
78: countermeasure setting section;
79: component type registration section;
9: carrier tape;
93: cavity section;
93X: cavity section;
K: substrate;
P: component;
A: specified angle;
HSn: normal height;
HMn: normal height;
HLn: normal height;
HSs: retraction height;
HMs: retraction height

The invention claimed is:

1. A component mounting machine comprising:
a component supply device configured to supply a component to a supply position;
a component mounting head configured to use a component mounting tool to pick up the component from the supply position and mount the component on a board;
a component detecting sensor configured to detect whether the component is present at the supply position before or while the component is being picked up by the component mounting tool; and
processing circuitry including:
a holding detecting section configured to detect whether the component mounting tool is holding the component following pickup;
a remaining detecting section configured to detect whether the component remains at the supply position in a case in which it is detected by the holding detecting section that the component is not being held by the component mounting tool; and
a dropped determining section configured to determine whether the component has dropped based on a detection result of the component detecting sensor, a detection result of the holding detecting section, and a detection result of the remaining detecting section.

2. The component mounting machine according to claim 1, wherein
the dropped determining section is configured to determine that the component has dropped in a case in which the component detecting sensor detects that there is a component at the supply position, the holding detecting section detects that the component mounting tool is not holding the component, and the remaining detecting section detects that the component is not remaining at the supply position.

3. The component mounting machine according to claim 1, wherein
the component mounting head is configured to hold the component mounting tool and for which a height when moving in a horizontal direction is adjustable, and
the processing circuitry further comprises a retraction control section configured to, in a case in which the dropped determining section determines that the component has dropped, perform retraction operation of moving the component mounting head at a retraction height that is higher than a normal height and that is a height at which a dropped component is avoided.

4. The component mounting machine according to claim 3, wherein
the component mounting head is configured to change the normal height along with automatic exchange of different types of the component mounting tool in accordance with a size of the component.

5. The component mounting machine according to claim 3, wherein
the retraction control section is configured to determine whether the retraction operation is required or determine the retraction height based on at least one of a type of the component mounting tool, a type of the component mounting head, a size of the dropped component, or a size of the component to be picked up from now.

6. The component mounting machine according to claim 3, further comprising:
a retraction operation notification section configured to notify a control performance state of the retraction control section to at least one of an upper control device or an operator.

7. The component mounting machine according to claim 1, wherein
the component mounting tool is a suction nozzle that picks up the component using negative pressure, and
the component detecting sensor includes a negative pressure measuring sensor configured to, when the component is picked up by the suction nozzle, measure the negative pressure to detect that the suction nozzle has contacted the component.

8. The component mounting machine according to claim 1, wherein
the component mounting tool is a suction nozzle that picks up the component using negative pressure, the component mounting head includes a nozzle holder configured to hold the suction nozzle via an elastic member to be vertically movable, and a raising and lowering drive section configured to raise and lower the nozzle holder, and
the component detecting sensor includes a height measuring sensor configured to, when the component is picked up using the suction nozzle, measure a relative height of the suction nozzle using the nozzle holder as a reference so as to detect that the suction nozzle has contacted the component.

9. The component mounting machine according to claim 7, wherein
the component supply device is a feeder device configured to use carrier tape, in which multiple cavity sections each housing the component are formed at a regular pitch, and feed the carrier tape one pitch at a time whenever pickup of the component is performed by the suction nozzle, and
the remaining detecting section is configured to be shared with the component detecting section, and to perform a same operation as the component detecting sensor with respect to a same of the cavity sections during pickup operation after the carrier tape has been returned by the regular pitch.

10. The component mounting machine according to claim 1, wherein
the component mounting head includes
a rotary tool on which multiple of the suction nozzles are arranged in a ring, and
a rotation drive section configured to, when pickup of the component is performed by a first suction nozzle of the multiple suction nozzles, the first suction nozzle being positioned at a pickup position above the supply position, rotate the rotary tool by a specified angle, position the first suction nozzle at a detection position, and position a second suction nozzle of the multiple suction nozzles at the pickup position, wherein
the holding detecting section includes a captured image processing section configured to detect whether the first suction nozzle is holding the component by capturing an image of the first suction nozzle positioned at the detection position, and performing image processing on acquired image data.

11. The component mounting machine according to claim 10, wherein
the remaining detecting section is configured to be shared with the component detecting section, and to perform a same operation as the component detecting sensor after the rotary tool has been rotated in a reverse direction by the specified angle using the rotation drive section.

12. The component mounting machine according to claim 1, wherein
targets for dropped determination are the components that are a specified size or larger.

13. A component dropped determining method for determining whether a component has dropped at a component mounting machine including a component supply device configured to supply a component to a supply position, and a component mounting head configured to use a component mounting tool to pick up the component from the supply position and mount the component on a board, the component dropped determining method comprising:
a component detecting process for detecting whether the component is present at the supply position before or while the component is being picked up by the component mounting tool;
a holding detecting process for detecting whether the component mounting tool is holding the component following pickup;
a remaining detecting process for detecting whether the component remains at the supply position in a case in which it is detected by the holding detecting process that the component is not being held by the component mounting tool; and
a dropped determining process for determining whether the component has dropped based on a detection result of the component detecting process, a detection result of the holding detecting process, and a detection result of the remaining detecting process.

* * * * *